United States Patent [19]
Chien

[11] Patent Number: 5,484,747
[45] Date of Patent: Jan. 16, 1996

[54] SELECTIVE METAL WIRING AND PLUG PROCESS

[75] Inventor: Sun-Chieh Chien, Hsin-Chu, China

[73] Assignee: United Microelectronics Corporation, Hsinchu, Taiwan

[21] Appl. No.: 450,418

[22] Filed: May 25, 1995

[51] Int. Cl.⁶ .................................. H01L 21/44
[52] U.S. Cl. .................... 437/190; 437/192; 437/203; 437/231
[58] Field of Search ................... 437/190, 192, 437/195, 203, 225, 231, 228, 200

[56] References Cited

U.S. PATENT DOCUMENTS

| | | | |
|---|---|---|---|
| 4,884,123 | 11/1989 | Dixit et al. | 357/71 |
| 4,898,841 | 2/1990 | Ito | 437/200 |
| 5,071,789 | 12/1991 | Nakata | 437/192 |
| 5,084,413 | 1/1992 | Fujita et al. | 437/203 |
| 5,128,278 | 7/1992 | Harada et al. | 437/192 |
| 5,187,120 | 2/1993 | Wang | 437/192 |
| 5,219,789 | 6/1993 | Adan | 437/192 |
| 5,358,621 | 10/1994 | Oyama | 437/192 |
| 5,422,310 | 6/1995 | Ito | 437/192 |
| 5,427,981 | 6/1995 | Choi | 437/194 |
| 5,432,126 | 7/1995 | Oikawa | 437/203 |

Primary Examiner—Tuan H. Nguyen
Attorney, Agent, or Firm—George O. Saile; Wolmar Stoffel

[57] ABSTRACT

A structure and method are provided for forming a plug contact and a metal line pattern in a semiconductor device. A contact hole is etched through a first dielectric layer. A second dielectric layer is formed overlying the first layer having first opening that defines a first metal layer and plug contact. A nucleation layer, such as Ti/TiN or Ti/TiW, is formed on the exposed surfaces of the contact hole and first opening. A planarizing layer is formed which fills the contact hole, and at least partially fills the first openings thereby masking portions of the nucleation layer. Unmasked portions of the nucleation layer are removed and then the planarizing layer is removed. A metal is selectively deposited on the remaining nucleation layer portions to fill the contact hole and substantially filling the first opening. The metal in the first opening forms a plug contact to the bottom surface and a metal line pattern. This process has the advantages of forming two metal levels—i.e., the plug contact and the first metal pattern—with one deposition process as well as defining the metal lines using a selective deposition, not a metal photo/etch process.

16 Claims, 3 Drawing Sheets

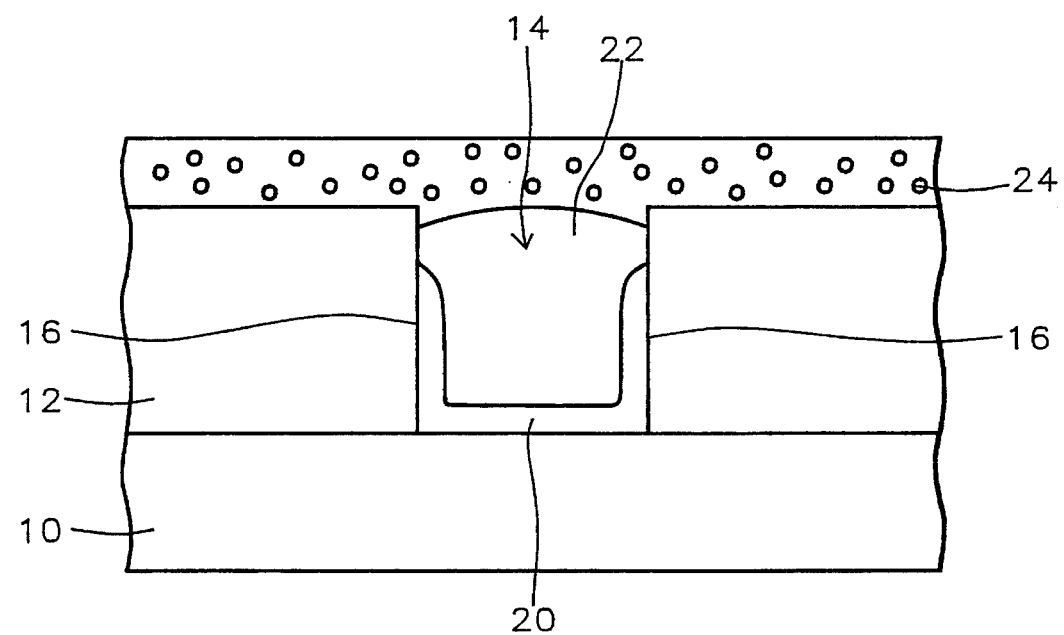
FIG. 1 – Prior Art
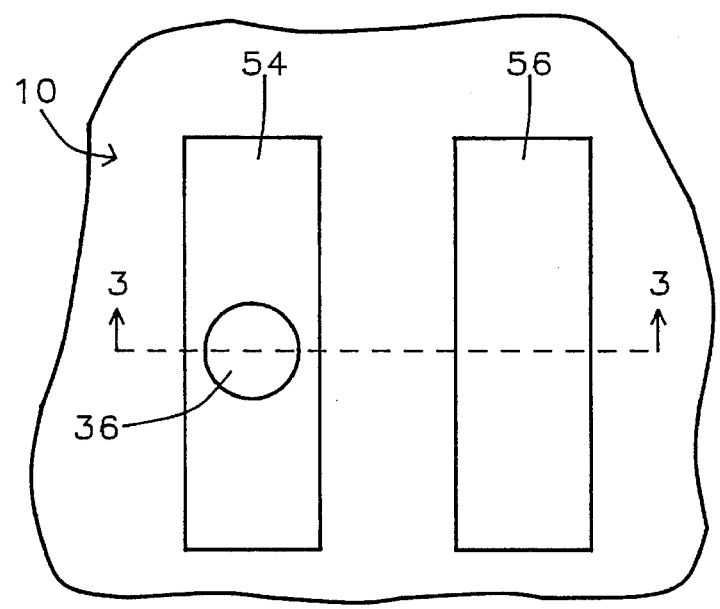
FIG. 2

SELECTIVE METAL WIRING AND PLUG PROCESS

BACKGROUND OF INVENTION

1) Field of the Invention

This invention relates to structures and methods of filling contact holes and forming metal patterns in semiconductor devices.

2) Description of the Prior Art

In the fabrication of semiconductor devices, electrical interconnections (i.e., contacts or plugs) are typically made by forming contact holes in a dielectric isolation layer to expose regions of the semiconductor device to which electrical contact must be made, and depositing a metal plug in each contact hole. Next, a metal layer is formed over the plug and dielectric layer. The metal layer is then formed into a metal pattern using conventional photolithographic/etching techniques. While in the past this metal deposition and photo/etching technique has proved effective, the smaller metal pattern line widths of present and future technologies create problems which need to be addressed.

In a conventional process for forming interconnections and metal patterns, shown in FIG. 1, an oxide layer 12 is formed on a substrate 10. A contact hole 14 having sidewalls 16 and a bottom surface 18 is formed in the oxide layer 12. A conformal adhesion layer 20 is formed over the exposed surfaces 12, 16, and 18. The adhesion layer 20, which can be formed of Ti and TiN, is used to promote the selective deposition of the plug metal 22 that fills the contact hole 14. Next, the contact hole 14 is substantially filled with a spin on glass layer which masks the underlying adhesion layer 20. The unmasked adhesion layer is etched away and then the spin on glass layer is removed. A contact metal 22 (interconnect or plug), such as tungsten, is deposited and etched back to fill the contact hole 14. Then a metal layer 24, such as aluminum, is formed on the exposed surfaces. Next, conventional photolithographic and etch processes are used to form the metal layer into a metal line pattern.

This conventional process has several disadvantages. Two metal depositions are use to form the plug 22 and the metal line pattern which increases costs and process complexity. Moreover, as the metal line widths decrease, the conventional photolithographic processes have less precision and increase in cost. With the conventional process, it is difficult to define metal lines by etching without forming "stringers". To remove metal stringers, the metal line pattern must be intensively over etched thereby increasing manufacturing costs and reducing line resolution. Moreover, the metal line resolution is limited by the metal etch "loading effect", especially for 0.5 micron and smaller line patterns. Therefore, metal line resolution could be improved if the metal lines were defined by a more accurate, non-etch process.

Also, special photoresist processes for metals, such as Anti-Reflection-Coating (ACR) and thick photo resist, are required for increased resolution and to compensate for the erosion of the photoresist. Thick photoresist is required to compensate for photoresist that is eroded during the metal overetch so that the metal lines are not exposed.

It is desirous to develop a process and structure whereby the metal line patterns are defined by an easier, cheaper, and more precise process than the conventional photo process. Also desirous is a process whereby the contact plug and metal pattern layer could be accurately formed in one metal deposition step with improved metal line resolution.

The following U.S. patent provide additional background for forming contact plugs and metal line patterns.

U.S. Pat. No. 4,898,841 to Ho teaches a method of filling contact holes whereby a tungsten silicide layer is formed on the sidewalls of a contact hole.

U.S. Pat. No. 5,219,789 to Adan discloses a method of forming a contact whereby a spin-on-glass layer is used to mask a TiW adhesion layer which coats the surfaces of a contact hole. This is used to form TiW adhesion layer along side wall and bottom of a contact hole for a subsequent selective metal chemical vapor deposition.

U.S. Pat. No. 5,187,120 to Wang discloses a contact formation method whereby a first TiN layer is formed on the bottom of a contact hole in a dielectric layer to promote the nucleation of tungsten. A second layer that resists nucleation of tungsten is formed on the surface of the dielectric layer.

U.S. Pat. No. 4,884,123 to Dixit et al., teaches a contact plug employing a Ti/TiN layer lining the contact hole and on the surface of the top insulation layer. However, two metal depositions are used to form the contact plug and the metal pattern layer. Also, the metal lines are defined by a conventional photo process.

While these methods improve the reliability and manufacturability of electrical contacts and metal layers, further improvement is desirable.

SUMMARY OF INVENTION

It is an object of the invention to provide a structure and process for forming an improved electrical interconnection (e.g., contact plug) and metal pattern in a multi-layered semiconductor circuit.

A more specific object of the present invention is to provide an improved structure and method of forming a contact plug and a metal line pattern in single metal deposition step with improved metal line spacing resolution.

Another specific object to the present invention is to provide a structure and method of forming a contact plug and a metal line pattern by an non-etching technique thereby reducing process complexity and further improving metal line resolution.

These needs are met by the present invention which provides a structure and method of forming an electrical contact plug and a metal line pattern for a multi-layer semiconductor device wherein a Ti/TiN nucleation layer is formed in a contact hole and in openings defining the metal pattern. Tungsten is selectively deposited in the contact hole and the openings thereby forming an electrical plug contact and a metal pattern in a single deposition step.

In the method of the present invention for forming a contact plug and metal pattern, a contact hole having sidewalls and a bottom, is etched through a first dielectric layer formed on a semiconductor substrate. A patterned photoresist layer is formed on the first dielectric layer and in the contact hole. The patterned photoresist layer will be used to define a metal line pattern.

A second dielectric layer overlying the first dielectric layer is formed using the first photoresist pattern as a mask. The second dielectric layer is preferably an oxide formed by liquid phase deposition (LPD). The photoresist is then removed thereby forming openings in the second dielectric layer. Some of the openings at least partially overlie the contact hole. The second dielectric layer has substantially vertical sidewalls that define the openings. Next, a nucleation layer, preferably Ti/TiN, is formed on the second dielectric layer, on the sidewalls of the contact hole and the sidewalls of the openings in the second dielectric layer. A planarizing layer is deposited which fills the contact hole, and at least partially fills the openings thereby masking portions of the nucleation layer. The unmasked portions of the nucleation layer are etched away and the planarizing layer is then removed. A metal is selectively deposited on the nucleation layer to substantially fill the contact hole and the openings thereby forming a plug contact to the bottom surface and a metal line pattern. The plug contact can be made to devices in the substrate or to underlying conductive layers.

BRIEF DESCRIPTION OF THE DRAWINGS

The drawings show the following:

FIG. 1 is a cross-sectional view in broken section in greatly enlarged scale that illustrates a structure and process of forming interconnects and metal line patterns in accordance with the prior art.

FIG. 2 is a top plan view in greatly enlarged scale that illustrates a process for forming an electrical interconnection and metal line pattern in accordance with the present invention.

DETAILED DESCRIPTION OF THE PREFERRED EMBODIMENTS

The present invention will be described in detail with reference to the accompanying drawings. It should be noted that the drawings are in greatly simplified form. In practice the device structure will be one of many supported on a common substrate connected with suitable metallurgy in various known electronic circuit configurations.

FIGS. 2 through 6, illustrate a structure and a method of forming the electrical interconnection and metal pattern of the present invention. FIG. 2 shows a top plan view of metal patterns 54, 56 and contact hole 36/interconnect (i.e., contact or plug) on a substrate 10.

Figure 3:
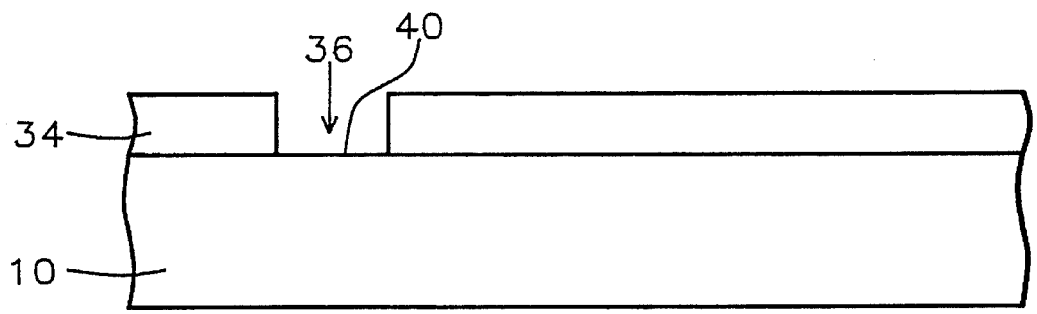
FIGS. 3 through 6 are a sequence of cross-sectional views along line 3 in FIG. 2, in broken section in greatly enlarged scale that illustrate a process for forming an electrical interconnection in accordance with the invention.

As shown in FIG. 3, a first dielectric layer 34 is formed on a substrate 10. For this illustration, first dielectric layer 34 is formed on a substrate 10 which can be a monocrystalline silicon semiconductor body with many devices (not shown) fabricated therein, as is well known in the art. Alternately, substrate 10 can be a metal or conductive layer, such as a doped polysilicon. The first dielectric layer 34 is preferably formed of silicon oxide and has a thickness in the range from about 3000 to 10,000 Å. Contact hole (or opening) 36 having substantially vertical sidewalls and a bottom surface 40 is formed in the first dielectric layer 34 exposing a bottom contact surface 40.

Figure 4:
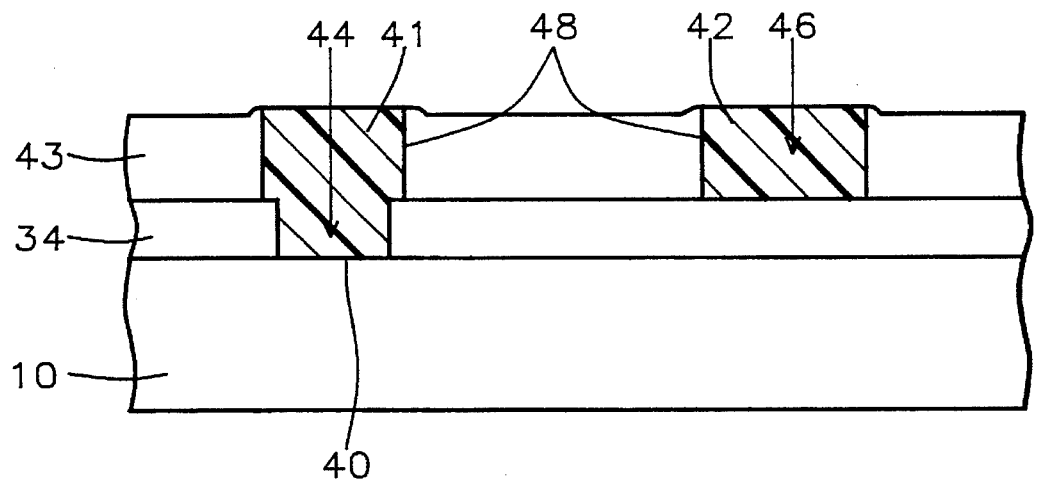

.As shown in FIG. 4, a photoresist pattern 41, 42 is formed on the first dielectric layer 34 and in the contact hole 36. Photoresist pattern 41, 42 defines the metal line pattern. Next, a second dielectric layer 43 is formed overlying the first dielectric layer 34 in the areas not covered (i.e., not masked) by the photoresist pattern 41, 42. It is very important that the second dielectric layer 43 is formed of silicon oxide ($SiO_2$) made by a liquid phase deposition (LPD) process.

The preferred liquid phase deposition (LPD) process is performed at a temperature in the range of about 25° C. to 40° C. The liquid is prepared by dissolving highly purified silica particles ($SiO_2$) in hydrofluosilicic acid ($H_2SiF_6$) at 35° C. to obtain a saturated solution with silica, followed by filtering to remove undissolved silica. Then, boric acid ($H_3BO_3$) continuously added in the solution to maintain the supersaturated solution. Film deposition is carried out by only immersion substrates in the solution at the same temperature. The reaction is explained by the following chemical formulas:

(1) $H_2SiF6 + 2H_2O \leftrightharpoons 6HF + SiO_2\downarrow$ (2) $H_3BO_3 + 4HF \leftrightharpoons BF_4^- + H_3O^+ + 2H_2O$ LPD oxide layer 43 has a thickness in the range from about 3000 to 10,000 Å and more preferably about 5000 k Å.

The photoresist 41, 42 is etched away thereby forming first and second openings 44, 46 having substantially vertical sidewalls 48. The first opening 44 at least partially overlies the contact hole 36 and forms a combination metal plug contact and metal line pattern. The second opening 46 defines the metal pattern without an underlying contact. Openings 44, 46 can have a width in the range of about 0.2 to 1.0 microns, and more preferably a width of about 0.3 to 0.5 microns.

Figure 5:
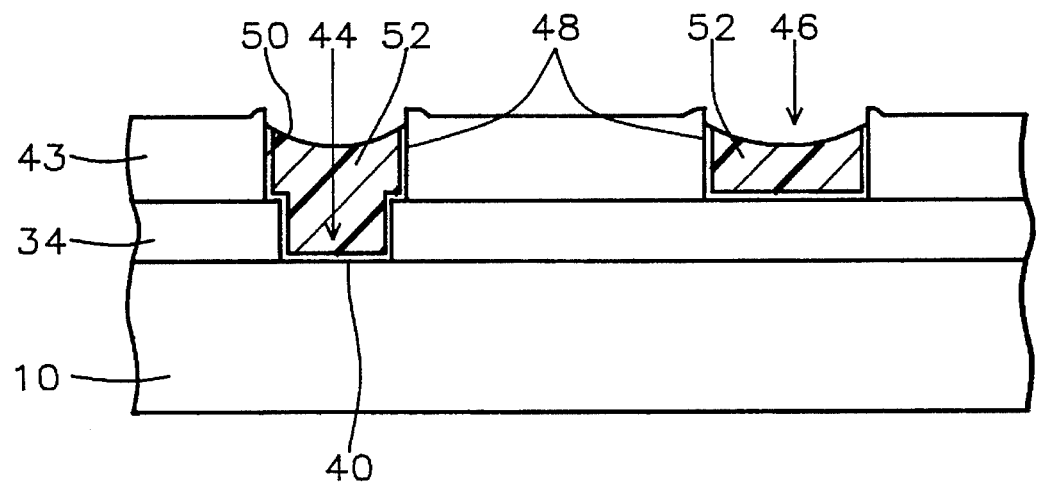

Referring to FIG. 5, a nucleation layer 50 is deposited on the second dielectric layer 34, on the sidewalls of the contact hole and the sidewalls 48 of the first and second openings 44, 46. The nucleation layer 50 promotes nucleation of tungsten so that tungsten will be selectively deposited on the surfaces coated with the nucleation layer 50. Nucleation layer 50 can be formed of a silicide such as $TiSi_2$, or $WSi_x$ and is preferably formed of Ti/TiN or Ti/TiW. Nucleation layer 50 can be formed by a sputtering or chemical vapor deposition process. The titanium layer in the Ti/TiN or Ti/TiW nucleation layer 50 can have a thickness in the range of about 300 to 500 Å and the TiN layer can have a thickness in the range of about 400 to 1000 Å.

Subsequently, a planarizing layer 52 is formed which fills the contact hole 36, and at least partially fills the first and second openings 44, 46 thereby masking portions of the nucleation layer 50. Planarizing layer 52 is preferably formed of spin on glass which can optionally be coated on the substrate surface and etched back. The planarizing layer can be etched back to a thickness to expose the top surface of the second dielectric layer and at least partially filling the first opening.

The portions of the nucleation layer 50 not masked by the planarizing layer 52 are etched away leaving the nucleation layer on the surfaces of the contact hole 36 and first and second openings 44, 46. The nucleation layer 50 formed of Ti/TiN can be etched by plasma etch, or a $H_2O_2/H_2O$ solution, or a $NH_4OH/H_2O_2/H_2O$ solution. A nucleation layer 50 formed of Ti/TiW can be etched by a plasma etch or an aqueous solution of $H_2O_2$. Following this, the planarizing layer 52 is etched away. Planarizing layer 52 can be etched by an HF solution.

Figure 6:
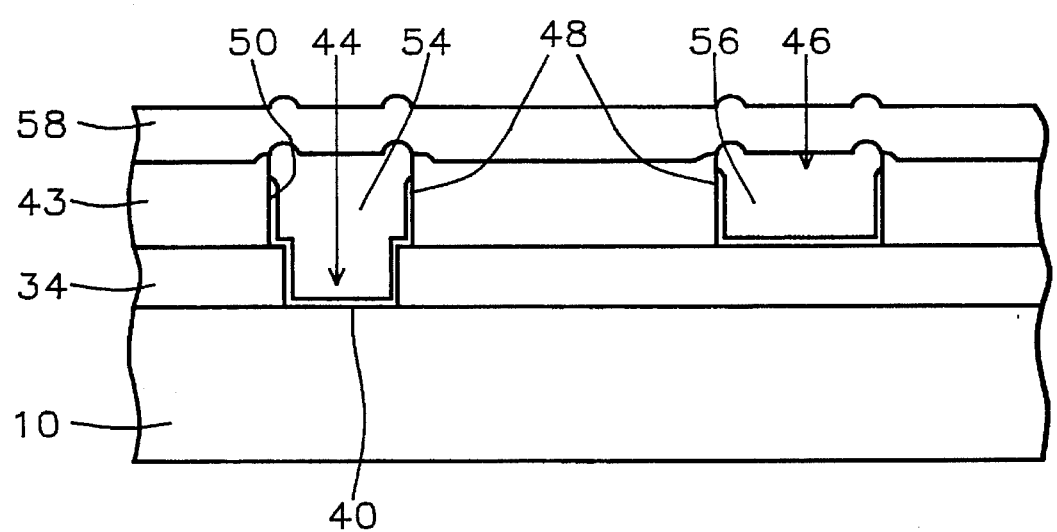

As illustrated in FIG. 6, a metal 54, 56 is selectively deposited on the remaining portions of the nucleation layer 50 so to substantially fill the contact hole 36 and the first opening 44 thereby forming a plug contact 54 to the bottom surface 40 and a portion of the metal line pattern 58. In addition, metal 56 fills the second opening 46 forming a portion of the metal line pattern. Metal 54, 56 is preferably formed of tungsten.

After the selective deposition of metal 54, 56, a third dielectric layer (oxide layer) 58 is formed over the metal 54, 56 and the planarizing layer 43. The third dielectric layer 58 can be formed of borophosphosilicate glass (BPSG), phosphosilicate glass (PSG), and $SiO_2$. The third dielectric layer 58 can be formed by an atmospheric pressure chemical vapor deposition, low pressure chemical vapor deposition, plasma enhanced chemical vapor deposition, or a liquid phase deposition (LPD) process. Third dielectric layer 58 has a thickness in the range from 3000 Å to 10,000 Å. The process of the invention can be repeated to form contacts/metal line patterns over the first level line patterns or any other level of lines.

With the present invention, two metal layers, the contact (plug) 54 and the first metal pattern 54, 56, are formed with one metal deposition, instead of the conventional two depositions. Moreover, the selective deposition of the metal 54, 56, using a nucleation layer 50, which is self aligned, allows smaller metal line widths to be formed without the complexity and problems associated with the conventional photolithographic processes (i.e., critical dimension control, resolution,) and convention metal etching problems (e.g., stringers, corrosion, profile control, etc.)

The method of the present invention, in which the metal lines and plug contact are defined by a LPD oxide masking technique, provides significant benefits over the photo/metal etching processes of the prior art. Since the metal pattern is defined by the photoresist, the pattern resolution is better than the conventional metal line etching where the resolution is degraded by surface roughness, reflectivity, and dyed resist. The metal etching of the conventional process is most seriously degraded by the "etching loading effect" for small line/space patterns. The present invention uses photoresist/LPD oxide to define the metal patterns and therefore does not suffer from the etching "loading effect" and provides better resolution than the conventional metal etching technique.

The phrase "electrical contact" is often reserved for an electrical interconnect directly to a device, and the phrase "electrical via" is often reserved for an electrical interconnection between to layers of a device. The invention disclosed here is applicable to formation of both electrical contacts and electrical vias, and the phrase "electrical interconnect" is used to refer to either contacts or vias.

While the invention has been particularly shown and described with reference to the preferred embodiments thereof, it will be understood by those skilled in the art that various changes in form and details may be made without departing from the spirit and scope of the invention.

What is claimed is:

1. A method of forming an electrical plug contact and a metal line pattern for a multi-layer semiconductor circuit, the method comprising the steps of:

forming a first dielectric layer on a substrate;

etching a contact hole through said first dielectric layer, said contact hole defined by substantially vertical sidewalls of said first dielectric layer and a bottom contact surface;

forming a patterned photoresist layer on a portion of said first dielectric layer and in said contact hole, said patterned photoresist layer in said contact hole at least partial overlying said first dielectric layer;

selectively forming a second dielectric layer overlying said first dielectric layer using said patterned photoresist layer as a mask;

removing said patterned photoresist layer thereby forming first openings in said second dielectric layer which define a metal line pattern and a contact, said first openings at least partially overlying said contact hole; said second dielectric layer having substantially vertical sidewalls that define said first openings;

depositing a nucleation layer on said second dielectric layer, said sidewalls of said contact hole, said sidewalls of said first opening, and said bottom contact surface;

forming a planarizing layer on said substrate surface which fills said contact hole, and at least partially fills said first openings thereby masking portions of said nucleation layer and leaving unmasked portions of said nucleation layer;

etching said unmasked portions of said nucleation layer;

removing said planarizing layer; and selectively depositing a metal on said nucleation layer to substantially fill said contact hole and said first openings thereby forming a plug contact to said bottom contact surface and a metal line pattern.

2. The method of claim 1 wherein said first dielectric layer is formed of silicon oxide having a thickness in the range from about 3000 to 10,000 Å.

3. The method of claim 1 wherein said second dielectric layer is formed of an oxide formed by a liquid phase deposition process, said oxide having a thickness in the range from about 3000 to 10,000 Å.

4. The method of claim 1 which further includes after the formation of said planarizing layer, etching back said planarizing layer to a thickness expose the top surface of said second dielectric layer which at least partially filling said first openings.

5. The method of claim 1 wherein said planarizing layer is formed of spin on glass having sufficient thickness to fill and cover said first openings.

6. The method of claim 1 wherein said nucleation layer is formed of a Ti layer and a TiN layer, said Ti layer having a thickness in the range from about 300 to 500 Å and said TiN layer having a thickness in the range from about 400 to 1000 Å.

7. The method of claim 1 wherein after the selective deposition of a metal, depositing an third dielectric layer over said metal line pattern and said second dielectric layer, said third dielectric layer having a thickness in the range from about 3000 to 10,000 Å.

8. The method of claim 1 wherein the bottom contact surface is an underlying conductive layer.

9. The method of claim 1 wherein said step of removing said patterned photoresist layer includes forming second openings in said second dielectric layer, said second openings not overlying said contact hole, said second openings receiving the same subsequent process steps as said first openings.

10. A method of forming an electrical plug contact and a metal line pattern for a multi-layer semiconductor circuit, the method comprising the steps of:

forming a first oxide layer on a substrate;

etching a contact hole through said first oxide layer, said contact hole defined by substantially vertical sidewalls of said first oxide layer and a bottom contact surface;

forming a patterned photoresist layer on a portion of said first oxide layer and in said contact hole, said patterned photoresist layer in said contact hole at least partial overlying said first oxide layer;

selectively forming a second oxide layer overlying said first oxide layer using said patterned photoresist layer as a mask;

removing said patterned photoresist layer thereby forming first and second openings in said second oxide layer which define a metal line pattern and a contact, said first openings at least partially overlying said contact hole; said second oxide layer having substantially vertical sidewalls that define said first and second openings;

depositing a Ti/TiN layer on said second oxide layer, on said sidewalls of said contact hole, said sidewalls of said first and second openings, and said bottom contact surface;

forming a spin-on-glass layer on said substrate surface which fills said contact hole, and at least partially fills said first and second openings thereby masking portions of said Ti/TiN layer and leaving unmasked portions of said Ti/TiN layer;

etching said unmasked portions of said Ti/TiN layer;

removing said spin-on-glass layer; and selectively depositing a metal on said Ti/TiN layer to substantially fill said contact hole and said first and second openings thereby forming a plug contact to said bottom contact surface and a metal line pattern.

11. The method of claim 10 wherein said second oxide layer is formed of liquid phase deposition oxide having a thickness in the range from about 3000 to 10,000 Å.

12. The method of claim 10 wherein after the formation of said spin on glass layer, etching back said spin on glass layer to a thickness in the range from about 1000 to 5000 Å.

13. The method of claim 10 wherein for said Ti/TiN layer, said Ti layer has a thickness in the range from 300 to 500 Å.

14. The method of claim 10 wherein said metal in the step of said selectively depositing is tungsten and after the selective deposition of tungsten, depositing an third oxide layer over said tungsten and said second oxide layer; said third oxide layer having a thickness in the range from about 3000 to 10,000 Å.

15. The method of claim 10 wherein said bottom contact surface is an underlying conductive layer.

16. The method of claim 10 wherein said first and second openings have different depths.

* * * * *